(12) United States Patent
Kyoh

(10) Patent No.: US 7,673,258 B2
(45) Date of Patent: Mar. 2, 2010

(54) DESIGN DATA CREATING METHOD, DESIGN DATA CREATING PROGRAM PRODUCT, AND MANUFACTURING METHOD OF SEMICONDUCTOR DEVICE

(75) Inventor: Suigen Kyoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 377 days.

(21) Appl. No.: 11/727,963

(22) Filed: Mar. 29, 2007

(65) Prior Publication Data

US 2007/0234243 A1  Oct. 4, 2007

(30) Foreign Application Priority Data

Mar. 31, 2006  (JP)  ............... 2006-099717

(51) Int. Cl.
*G06F 17/50* (2006.01)
*G06F 19/00* (2006.01)

(52) U.S. Cl. ............... 716/2; 716/10; 716/21; 703/98; 703/121

(58) Field of Classification Search .......... 716/2, 716/10, 21; 700/98, 121
See application file for complete search history.

(56) References Cited

U.S. PATENT DOCUMENTS

| 4,371,423 A | * | 2/1983 | Yoshizawa et al. ......... 438/670 |
| 4,616,401 A | * | 10/1986 | Takeuchi ..................... 438/297 |
| 5,500,080 A | * | 3/1996 | Choi .......................... 438/639 |
| 5,536,682 A | * | 7/1996 | Koyama ..................... 438/635 |
| 5,581,124 A | * | 12/1996 | Koyama ..................... 257/758 |
| 6,025,605 A | * | 2/2000 | Lyu ............................ 257/59 |
| 6,303,442 B1 | * | 10/2001 | Lee ............................ 438/276 |
| 6,573,573 B2 | * | 6/2003 | Lee ............................ 257/390 |
| 2002/0025611 A1 | * | 2/2002 | Lee ............................ 438/129 |
| 2005/0174552 A1 | * | 8/2005 | Takada et al. .............. 355/53 |
| 2005/0218440 A1 | * | 10/2005 | Park .......................... 257/298 |
| 2005/0235245 A1 | | 10/2005 | Kotani et al. |

FOREIGN PATENT DOCUMENTS

| JP | 2002-131882 | 5/2002 |
| JP | 2002-329783 | 11/2002 |
| JP | 2005-181523 | 7/2005 |
| JP | 2006-080224 | 3/2006 |

OTHER PUBLICATIONS

Korean Patent Office Notification for Filing Opinion issued in copending Application No. 10-2007-31692 mailed Apr. 28, 2008, and English language translation thereof.

* cited by examiner

*Primary Examiner*—Phallaka Kik
(74) *Attorney, Agent, or Firm*—Finnegan, Henderson, Farabow, Garrett & Dunner, L.L.P.

(57) ABSTRACT

According to an aspect of the invention, there is provided a design data creating method of creating design data of a semiconductor device including extracting an AND region of an upper layer wiring pattern and a lower layer wiring pattern that sandwich a contact hole layer pattern included in a pattern layer, extracting the contact hole layer pattern included in the AND region, and moving the contact hole layer pattern in such a manner that the center of the AND region coincides with the center of the contact hole layer pattern.

18 Claims, 8 Drawing Sheets

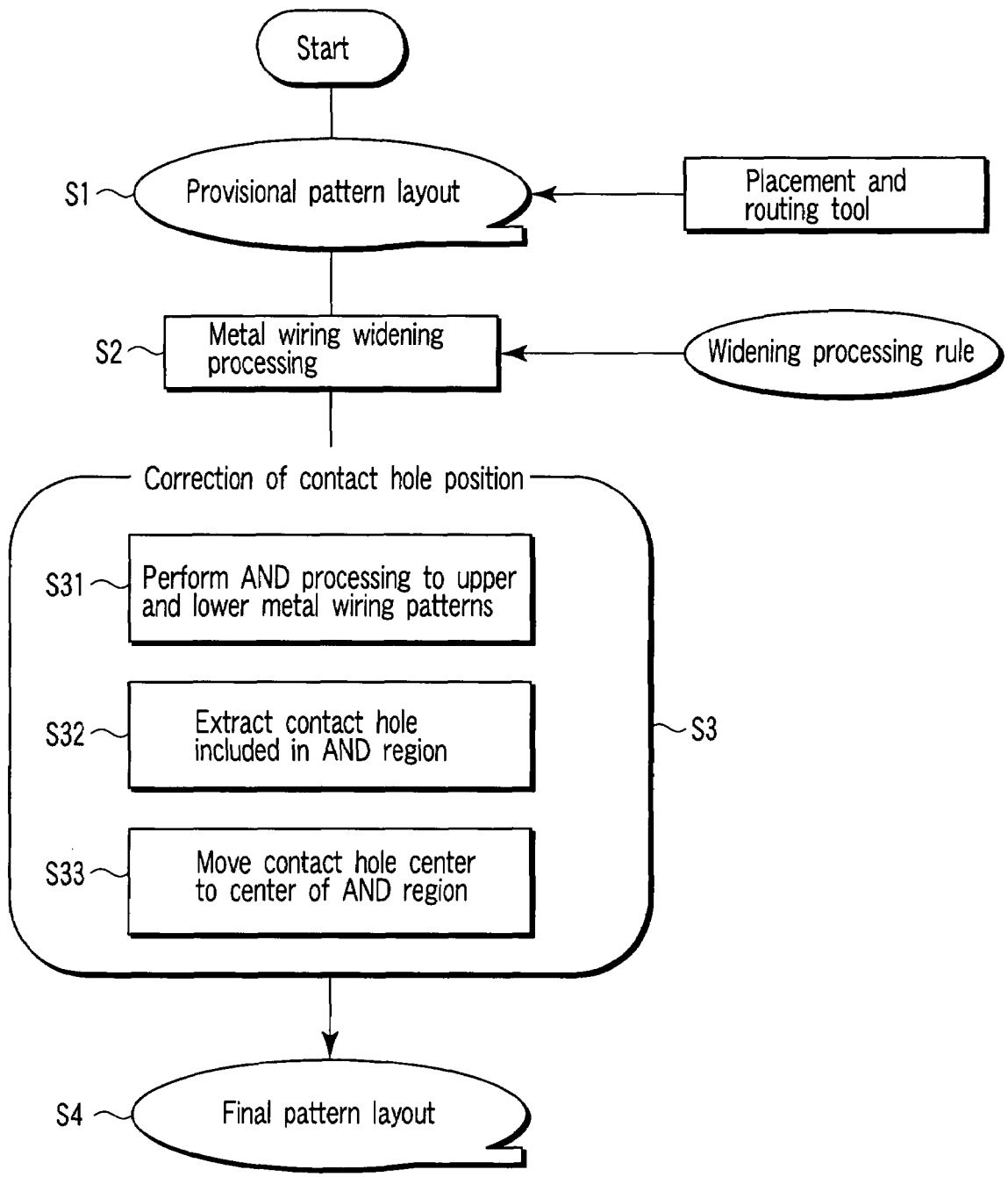
F I G. 1

FIG. 2A  After placement and routing

FIG. 2B  Widening processing, AND region extraction

FIG. 2C  Move Via to center of AND region

Simulated shape

Shape under condition 1

Simulated shape

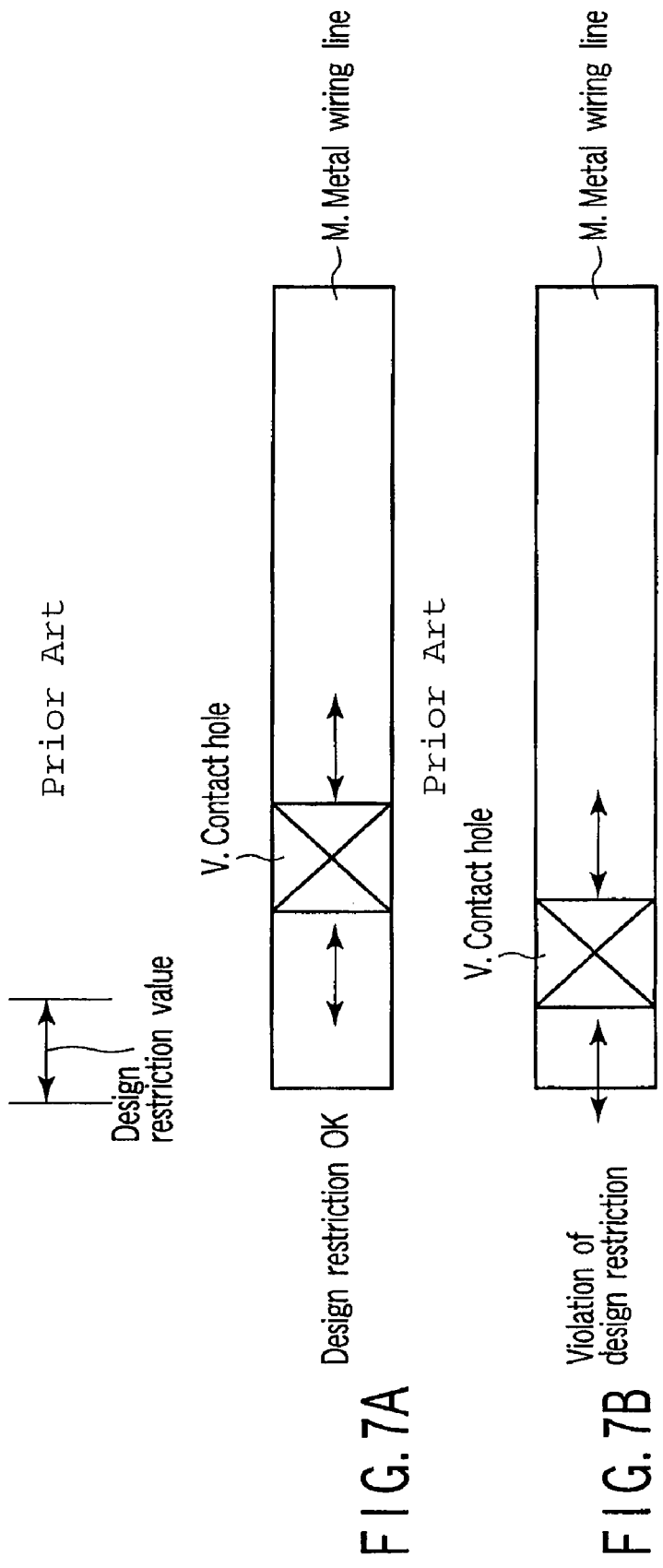

DESIGN DATA CREATING METHOD, DESIGN DATA CREATING PROGRAM PRODUCT, AND MANUFACTURING METHOD OF SEMICONDUCTOR DEVICE

CROSS-REFERENCE TO RELATED APPLICATIONS

This application is based upon and claims the benefit of priority from prior Japanese Patent Application No. 2006-099717, filed Mar. 31, 2006, the entire contents of which are incorporated herein by reference.

BACKGROUND OF THE INVENTION

1. Field of the Invention

The present invention relates to a design data creating method of correcting a position of a contact hole layer pattern when creating design data of a semiconductor device, a design data creating program product, and a manufacturing method of a semiconductor device.

2. Description of the Related Art

With miniaturization of a semiconductor device, a defect in electrical characteristics due to an interlayer matching displacement or a finished dimensional error has been a serious problem. For example, when an interlayer overlay of a metal wiring layer and a contact hole layer is displaced, a sufficient contact area cannot be assured. As a result, a contact resistance between layers is increased, RC delay occurs, and a signal timing becomes inconsistent. In addition, even when a finished shape of a metal wiring on a wafer becomes smaller than a designed shape because of an error in manufacturing processes, the contact resistance is increased.

FIGS. 7A and 7B are plan views showing interlayer design restrictions of a metal wiring layer and a contact hole layer. FIG. 7A is a view showing an example where the design restrictions are satisfied, and FIG. 7B is a view showing an example where the design restrictions are not met. In order to avoid an increase in contact resistance due to a reduction in contact area, on a design stage in a conventional technology, as shown in FIG. 7A, design restrictions are set to provide a margin between a metal wiring layer M and a contact hole layer V. Adopting this structure enables acquiring a specified contact resistance even if an interlayer matching displacement or a finished dimensional error is present.

In a conventional design data creating method of a semiconductor device, pattern shapes of a metal wiring layer and a contact hole layer are first determined by using a regular placement and routing tool. Then, in order to increase a manufacturing process margin of the metal wiring layer, processing of increasing a width of a metal wiring line at a position where the pattern is narrow, i.e., so-called widening processing is carried out. Therefore, a pattern of the metal wiring determined by the placement and routing tool is different from an actual pattern of the same obtained after the widening processing. It is to be noted that the contact hole layer is still arranged by using the placement and routing tool, and it is arranged based on design data before the widening processing for the metal wiring line is carried out.

FIGS. 8A, 8B, and 8C are views showing a conventional design data creating method of a semiconductor device. FIG. 8A is a view showing a pattern shape obtained after placement and routing, FIG. 8B is a view showing a pattern shape obtained after the widening processing, and FIG. 8C is a view showing a pattern shape obtained based on a simulation. In a provisional pattern layout obtained after placement and routing depicted in FIG. 8A, a contact hole layer V is symmetrically arranged widthways with respect to a corresponding metal wiring layer M. However, in the pattern shape after the widening processing depicted in FIG. 8B, the contact hole layer V is asymmetrically arranged (biased to the left). Therefore, a contact area of the metal wiring layer M and the contact hole layer V may not be sufficiently assured due to an interlayer mating displacement of metal wiring layer M and the contact hole layer V or a finished shape error caused by a manufacturing process.

FIG. 8C shows shapes of the metal wiring layer M and the contact hole layer V on a wafer when a simulation is carried out based on a pattern layout obtained after the widening processing. After the widening processing, it can be understood that V protrudes from a region of M due to shortening of an end side of M and a contact area of M and V is reduced in the simulation even though an interlayer matching displacement does not occur. That is, in such a pattern layout, a high process yield cannot be obtained in manufacture of a semiconductor device.

It is to be noted that Jpn. Pat. Appln. KOKAI Publication No. 2002-131882 discloses a method of extracting a pattern whose process margin with respect to fluctuations in an exposure amount and a focal distance does not reach a predetermined reference value from a design pattern of a mask that is used at a light exposure step of a semiconductor device designed in accordance with a predetermined design rule, and correcting the pattern in such a manner that the process margin satisfies the reference value.

BRIEF SUMMARY OF THE INVENTION

According to an aspect of the invention, there is provided a design data creating method of creating design data of a semiconductor device, comprising: extracting an AND region of an upper layer wiring pattern and a lower layer wiring pattern that sandwich a contact hole layer pattern included in a pattern layer; extracting the contact hole layer pattern included in the AND region; and moving the contact hole layer pattern in such a manner that the center of the AND region coincides with the center of the contact hole layer pattern.

According to another aspect of the invention, there is provided a design data creating method of creating design data of a semiconductor device, comprising: extracting an AND region of an upper layer wiring pattern and a lower layer wiring pattern that sandwich a contact hole layer pattern included in a pattern layout; extracting the contact hole layer pattern included in the AND region; and moving the contact hole layer pattern in such a manner that the contact hole layer pattern approximates the center of the AND region on a maximum level to satisfy predetermined design restrictions.

According to another aspect of the invention, there is provided a design data creating method of creating design data of a semiconductor device, comprising: simulating a pattern shape of each of an upper layer wiring pattern and a lower layer wiring pattern that sandwich a contact hole layer pattern included in a pattern layout under a plurality of process conditions considering a predetermined process error; determining a process condition under which a contact area of the upper layer wiring pattern, the lower layer wiring pattern, and the contact hole layer pattern becomes minimum from the plurality of process conditions based on a result of the simulation; extracting an AND region of a simulated shape of the upper layer wiring pattern and a simulated shape of the lower layer wiring pattern under the determined process condition; obtaining a gravity point of the AND region; and moving the contact hole layer pattern in such a manner that the gravity point of the AND region coincides with the center of the contact hole layer pattern.

According to another aspect of the invention, there is provided a program product which stores a program that allows a computer to execute: extracting an AND region of an upper layer wiring pattern and a lower layer wiring pattern that sandwich a contact hole layer pattern included in a pattern layout of a semiconductor device; extracting the contact hole layer pattern included in the AND region; and moving the contact hole layer pattern in such a manner that the center of the AND region coincides with the center of the contact hole layer pattern, thereby creating design data of the semiconductor device.

According to another aspect of the invention, there is provided a program product which stores a program that allows a computer to execute: extracting an AND region of an upper layer wiring pattern and a lower layer wiring pattern that sandwich a contact hole layer pattern included in a pattern layout; extracting the contact hole layer pattern included in the AND region; and moving the contact hole layer pattern in such a manner that the contact hole layer pattern approximates the center of the AND region on a maximum level to satisfy predetermined design restrictions.

According to another aspect of the invention, there is provided a program product which stores a program that allows a computer to execute: simulating a pattern shape of each of an upper layer wiring pattern and a lower layer wiring pattern that sandwich a contact hole layer pattern included in a pattern layout under a plurality of process conditions considering a predetermined process error; determining a process condition under which a contact area of the upper layer wiring pattern, the lower layer wiring pattern, and the contact hole layer pattern becomes minimum from the plurality of process conditions based on a result of the simulation; extracting an AND region of a simulated shape of the upper layer wiring pattern and a simulated shape of the lower layer wiring pattern under the determined process condition; obtaining a gravity point of the AND region; and moving the contact hole layer pattern in such a manner that the gravity point of the AND region coincides with the center of the contact hole layer pattern.

According to another aspect of the invention, there is provided a manufacturing method of a semiconductor device for forming a pattern on a semiconductor substrate by using a photomask, the photomask being manufactured by using design data of the semiconductor device created by: extracting an AND region of an upper layer wiring pattern and a lower layer wiring pattern that sandwich a contact hole layer pattern included in a pattern layout; extracting the contact hole layer pattern included in the AND region; and moving the contact hole layer pattern in such a manner that the center of the AND region coincides with the center of the contact hole layer pattern.

According to another aspect of the invention, there is provided a manufacturing method of a semiconductor device for forming a pattern on a semiconductor substrate by using a photomask, the photomask being manufactured by using design data of the semiconductor device created by: extracting an AND region of an upper wiring pattern and a lower wiring pattern that sandwich a contact hole layer pattern included in a pattern layout; extracting the contact hole layer pattern included in the AND region; and moving the contact hole layer pattern in such a manner that the contact hole layer pattern approximates the center of the AND region on a maximum level to satisfy predetermined design restrictions.

According to another aspect of the invention, there is provided a manufacturing method of a semiconductor device for forming a pattern on a semiconductor substrate by using a photomask, the photomask being manufactured by using design data of the semiconductor device created by: simulating a pattern shape of each of an upper wiring pattern and a lower wiring pattern that sandwich a contact hole layer pattern included in a pattern layout under a plurality of process conditions considering a predetermined process error; determining a process condition under which a contact area of the upper wiring pattern, the lower wiring pattern, and the contact hole layer pattern becomes minimum from the plurality of process conditions based on a result of the simulation; extracting an AND region of a simulated shape of the upper wiring pattern and a simulated shape of the lower wiring pattern under the determined process condition; obtaining a gravity point of the AND region; and moving the contact hole layer pattern in such a manner that the gravity point of the AND region coincides with the center of the contact hole layer pattern.

BRIEF DESCRIPTION OF THE SEVERAL VIEWS OF THE DRAWING

FIG. 1 is a flowchart showing a processing procedure of a design data creating method of a semiconductor device according to a first embodiment;

FIGS. 7A and 7B are views showing interlayer design restrictions of a metal wiring layer and a contact hole layer according to a conventional technology.

DETAILED DESCRIPTION OF THE INVENTION

Embodiments will now be explained hereinafter with reference to the accompanying drawings.

FIG. 1 is a flowchart showing a processing procedure of a design data creating method of a semiconductor device according to a first embodiment. A computer (not shown) executes a design data creating program stored in it or a storage medium (not shown) to carry out the design data creating method according to the first embodiment. The storage medium is a memory device, magnetic disk device, optical disk device, or the like, and is provided as a program product in which the program is stored.

First, in step S1, a placement and routing tool is used to provisionally determine a pattern layout of a metal wiring layer and a contact hole layer. Then, in step S2 as a first process, a pattern included in the metal wiring layer in the pattern layout is subjected to widening processing (processing of increasing a lithography margin with respect to the pattern layer to enlarge a width of the pattern) in accordance with a predetermined rule to increase a manufacturing process margin. Subsequently, in step S3 as a second process, a position of the contact hole layer included in the pattern layout subjected to widening processing is corrected. This contact hole layer achieves electrical conduction between the metal wiring layers.

Figure 2:
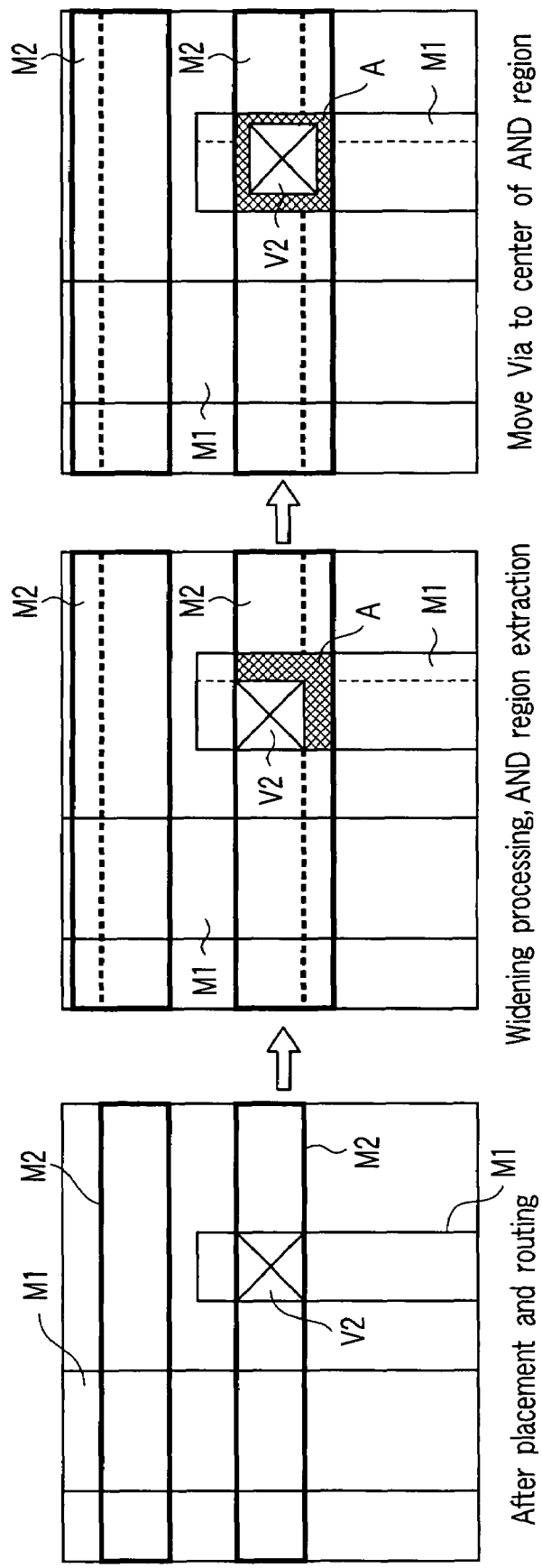
FIGS. 2A, 2B, and 2C are views for explaining particulars about a second step according to the first embodiment.

FIGS. 2A, 2B, and 2C are views for explaining particulars about the second process. FIG. 2A shows a pattern layout obtained after placement and routing, and a metal lower wiring line M1 is electrically connected with a metal upper wiring line M2 via a contact hole layer V2. That is, the metal lower wiring line M1 and the metal upper wiring line M2 sandwich the contact hole layer V2 therebetween.

FIG. 2B shows a result of executing the widening processing with respect to this pattern layout. In the pattern layout after placement and routing depicted in FIG. 2A, a V2 pattern is arranged at the center of a region where an M1 pattern crosses an M2 pattern. However, in a pattern layout after the widening processing depicted in FIG. 2B, the V2 pattern is not arranged at the center.

In order to correct this arrangement, in step S31, a Boolean operation is utilized to extract an AND region A where a pattern included in the metal lower layer wiring M1 and a pattern included in the metal upper layer wiring M2 overlap each other. In step S32, whether the contact hole layer V2 pattern is included in the AND region A is judged. When the V2 pattern is included in the AND region A, the V2 pattern is moved in such a manner that the center of the V2 pattern to be noticed coincides with the center of the AND region A as shown in FIG. 2C in step S33. This movement of the V2 pattern is carried out with respect to all V2 patterns included in the pattern layout. In step S4, the pattern layout is determined.

The thus created design data is used to manufacture a photomask. Next, the photomask is mounted on a photolithography apparatus to expose a semiconductor substrate, thereby manufacturing a semiconductor device.

In the thus obtained pattern layout, the contact hole layer pattern is symmetrically arranged widthways with respect to a corresponding metal wiring layer pattern. Therefore, even if an interlayer matching displacement of the metal wiring layer and the contact hole layer or a dimensional error is present, a contact area of the metal wiring layer and the contact hole layer can be sufficiently assured.

Figure 3:
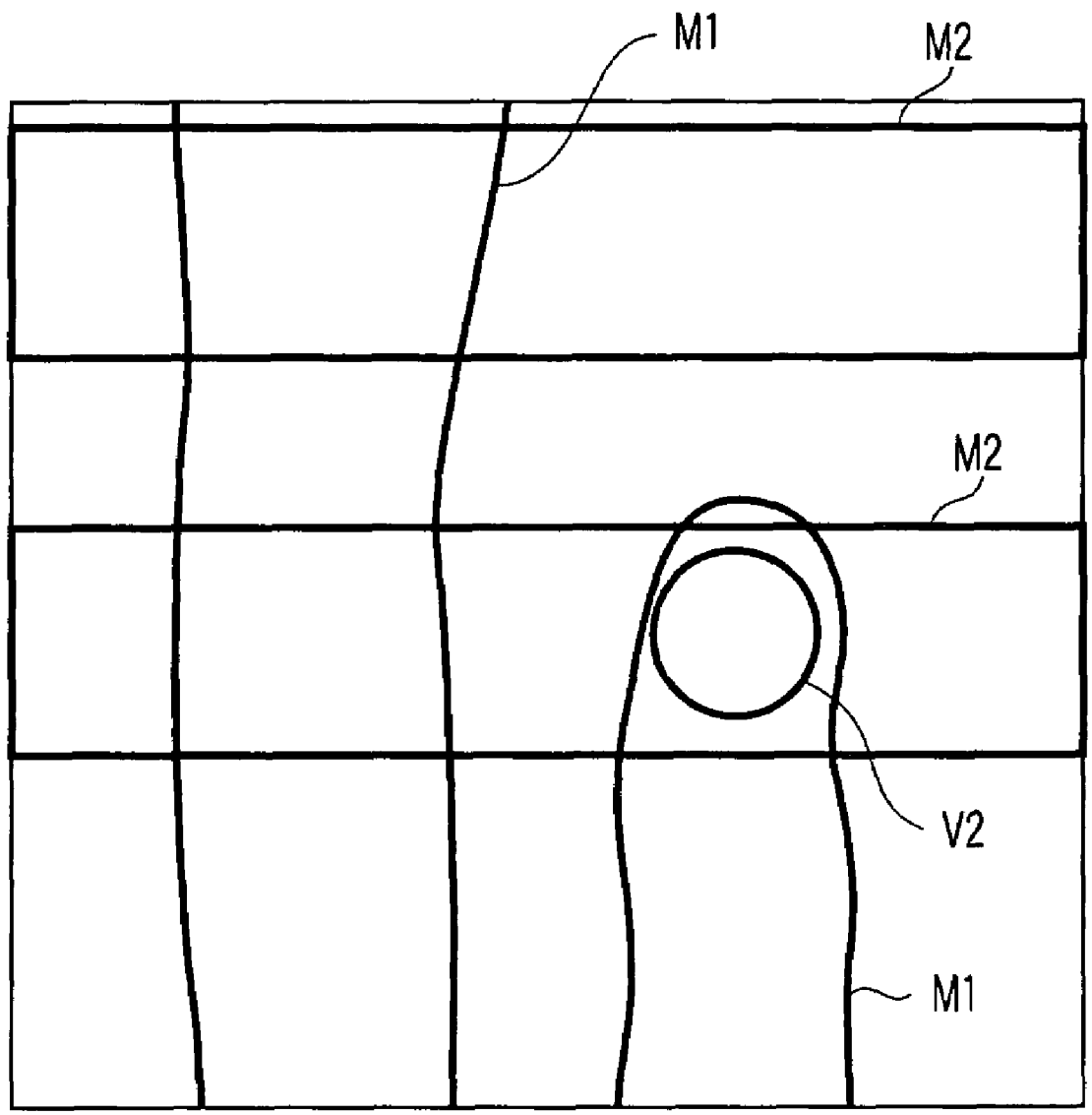
FIG. 3 is a view showing simulated shapes of a metal lower wiring line, a contact hole layer, and a metal upper wiring line on a wafer in determined pattern layout according to the first embodiment.
Figure 8B:
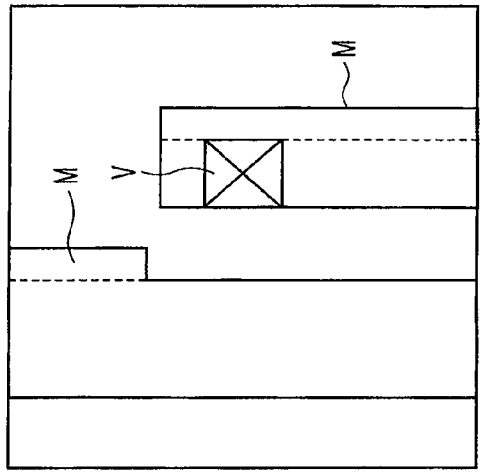
FIGS. 8A, 8B, and 8C are views showing a design data creating method of a semiconductor device according to a conventional technology.
Figure 8C:
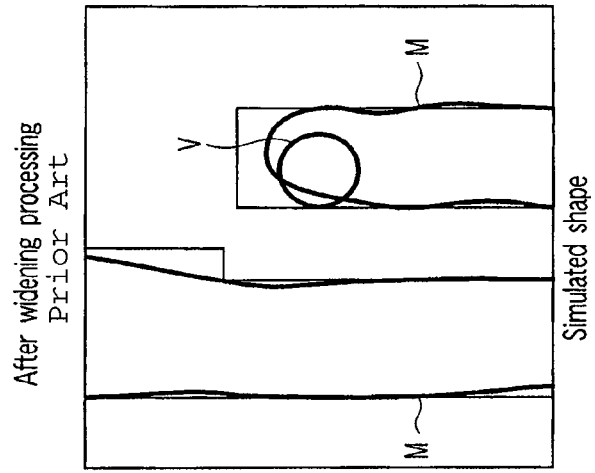
Figure 8A:
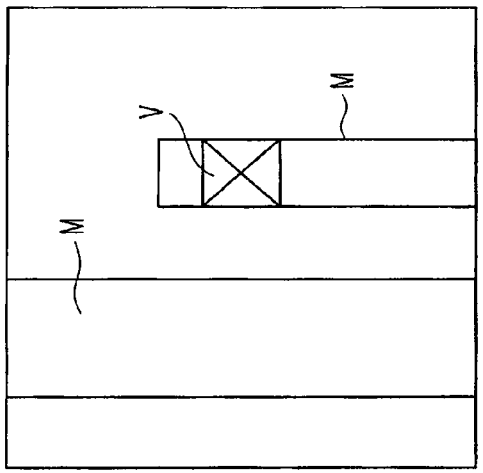

FIG. 3 is a view showing simulated shapes of the metal lower layer wiring M1, the contact hole layer V2, and the metal upper layer wiring M2 on a wafer in the determined pattern layout. In FIG. 3, like FIG. 8C, although an end side of one M1 is shortened, V2 does not protrude from M1, and a contact area of M1 and V2 is sufficiently assured. In this manner, a high process yield can be obtained in manufacture of a semiconductor device.

Further, data of the thus moved contact hole is stored as a history. For example, when the metal wiring layer pattern is again produced by the placement and routing tool for design refinement, the metal wiring layer pattern is generated targeting a corrected position of the contact hole.

Furthermore, the description has been given on the assumption that both the lower wiring line and the upper wiring line are the metal wiring lines as the wiring layers in the first embodiment. However, even if an element region and a gate of a transistor are assumed as the lower wiring line, the same effect can be obviously obtained.

When a computer (not shown) executes a design data creating program stored in it or a storage medium (not shown), a design data creating method according to a second embodiment is carried out. In this second embodiment, a pattern layout is first determined in accordance with the processing procedure depicted in FIG. 1 like the first embodiment.

First, in step S1, a placement and routing tool is used to provisionally determine a pattern layout of a metal wiring layer and a contact hole layer. Then, in step S2 as a first process, a pattern included in the metal wiring layer in the pattern layout is subjected to widening processing in accordance with a predetermined rule to increase a manufacturing process margin. Then, in step S3 as a second process, a position of the contact hole layer included in the pattern layout after the widening processing is corrected.

Figure 4A:
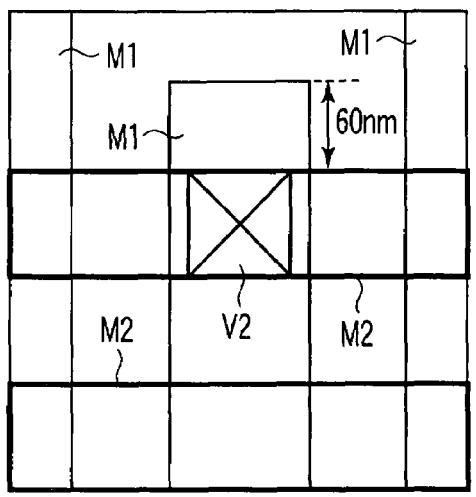
FIGS. 4A, 4B, 4C, and 4D are views for explaining particulars about a second step according to a second embodiment.
Figure 4B:
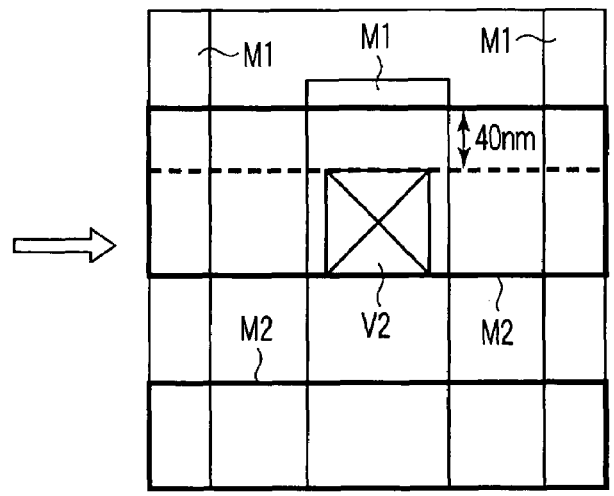
Figure 4C:
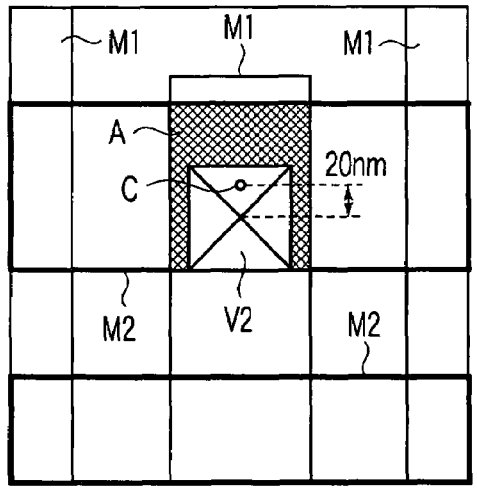

FIGS. 4A, 4B, 4C, and 4D are views for explaining particulars about the second process. FIG. 4A shows a pattern layout obtained after placement and routing, and one metal lower layer wiring M1 is electrically connected with one metal upper layer wiring M2 via a contact hole layer V2. FIG. 4B shows a result of effecting the widening processing with respect to this pattern layout.

In step S31, a Boolean operation is utilized to extract an AND region of an M1 pattern and an M2 pattern obtained after the widening processing. In step S32, when a V2 pattern is present in this AND region, the V2 pattern is moved in such a manner that the center of the V2 pattern coincides with the center of the AND region in step S33. However, at this moment, predetermined design restrictions must be met. Here, when the design restrictions cannot be satisfied, the V2 pattern is moved in such a manner that the center of the V2 pattern coincides with a position that is closest to the center of the AND region to satisfy the design rules.

For example, a design restriction that a distance of 50 nm or above must be maintained between one edge in one of two pairs of opposed edges of the contact hole layer V2 and a pattern edge of the metal lower layer wiring M1 is set.

Figure 4D:
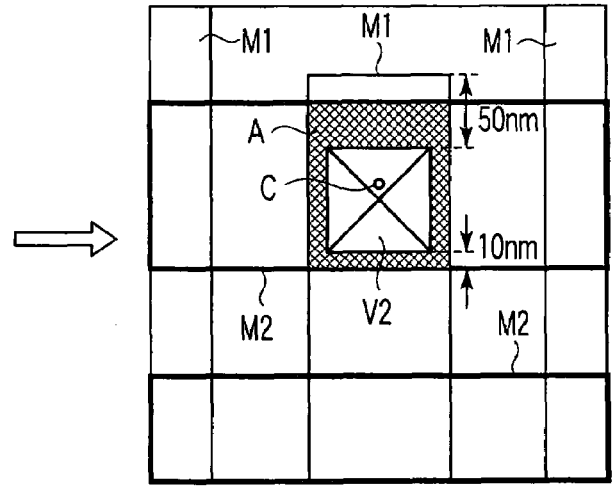

In FIG. 4A, a distance between an upper edge of the metal lower layer wiring M1 after placement and routing and one edge of the contact hole layer V2 is 60 nm. When the widening processing is carried out, the upper layer M2 pattern is 40 nm widened as shown in FIG. 4B, and the center C of the AND region A of the M1 pattern and the M2 pattern is upwardly moved for 20 nm as compared with the layout obtained after placement and routing. However, when the V2 pattern is upwardly moved for 20 nm to match the center of the V2 pattern with the center C of the AND region A, a distance between the upper edge of M1 and the edge of the contact hole layer V2 becomes 40 nm, and hence the design restriction is not satisfied. Thus, as shown in FIG. 4D, the V2 pattern is upwardly moved for 10 nm to satisfy the design restriction and move the center C of the AND region A to the center of V2 pattern as close as possible. In this case, the distance between the upper edge of the M1 and the edge of the contact hole layer V2 becomes 50 nm.

The thus created design data is used to manufacture a photomask. Next, the photomask is mounted on a photolithography apparatus to expose a semiconductor substrate, thereby manufacturing a semiconductor device.

In the thus obtained pattern layout, the contact hole layer pattern is arranged with respect to a corresponding metal wiring layer pattern in such a manner that the design restriction is met and the center of the contact hole layer pattern approximates the center of the AND region on a maximum level. Therefore, even if an interlayer matching displacement of the metal wiring layer and the contact hole layer or a dimensional error is present, a contact area of the metal wiring layer and the contact hole layer can be sufficiently assured, thereby acquiring a high process yield in manufacture of a semiconductor device.

It is to be noted that the interlayer design restriction of the metal wiring layer and the contact hole layer has been exemplified in the second embodiment, but a contact hole can be moved to avoid violation of a design rule in the contact hole layer.

According to a third embodiment, a pattern layout is created as follows.

Figure 5:
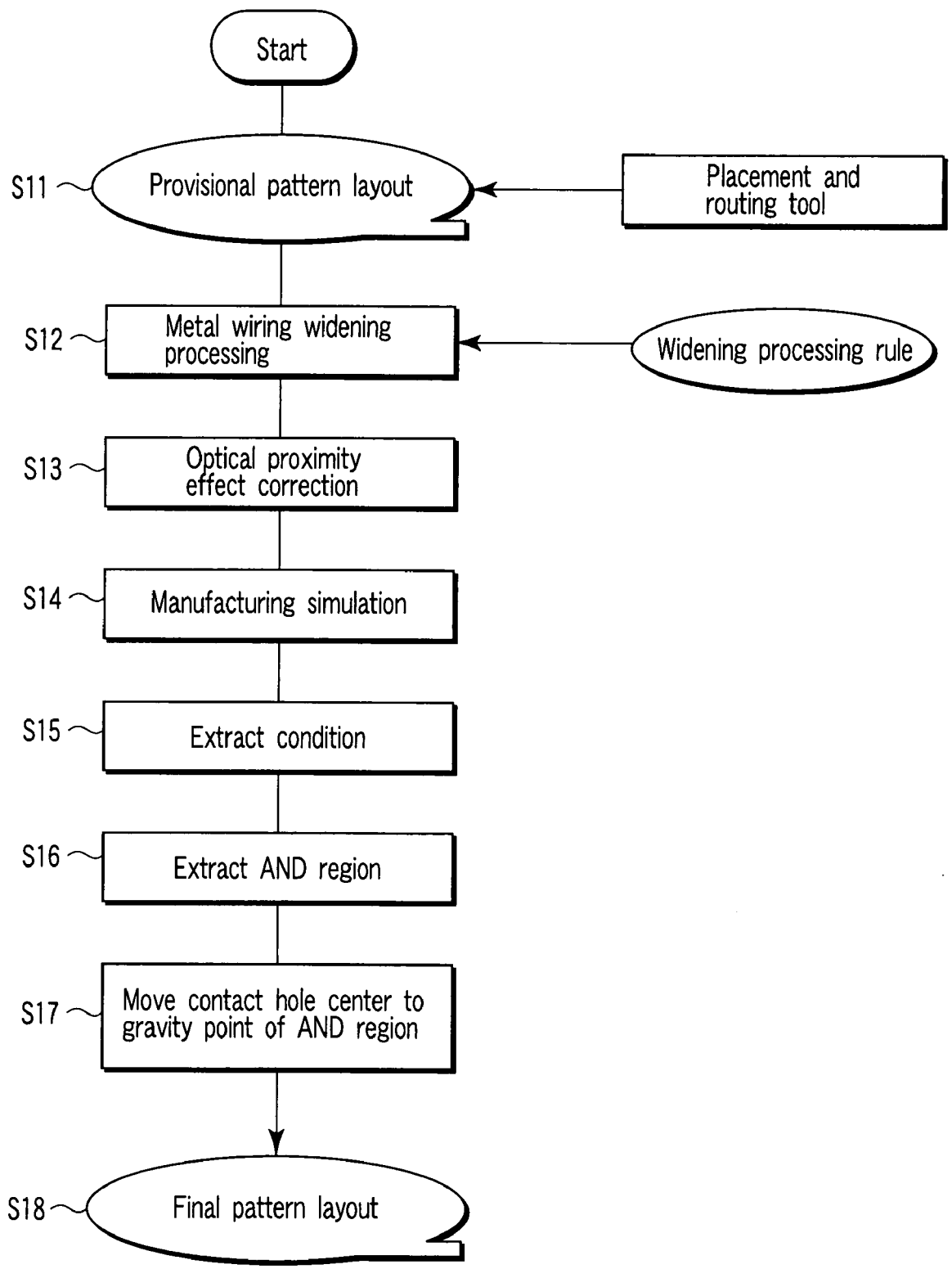
FIG. 5 is a flowchart showing a processing procedure of a design data creating method of a semiconductor device according to a third embodiment.

FIG. 5 is a flowchart showing a processing procedure of a design data creating method of a semiconductor device according to the third embodiment. A design data creating method according to the third embodiment is carried out when a computer (not shown) executes a design data creating program stored in it or a storage medium (not shown). The storage medium is a memory device, magnetic disk device, optical disk device, or the like, and is provided as a program product in which the program is stored.

First, in step S11, a placement and routing tool is used to provisionally determine a pattern layout of a metal wiring layer and a contact hole layer. Then, in step S12 as a first process, a pattern included in the metal wiring layer in the pattern layout is subjected to widening processing in accordance with a predetermined rule to increase a manufacturing process margin. Then, in step S13 as a second process, optical proximity effect correction is performed with respect to the metal wiring layer pattern obtained after the widening processing to determine a mask pattern. Subsequently, in step S14 as a third process, a manufacturing simulation for each metal wiring layer is performed.

Figure 6B:
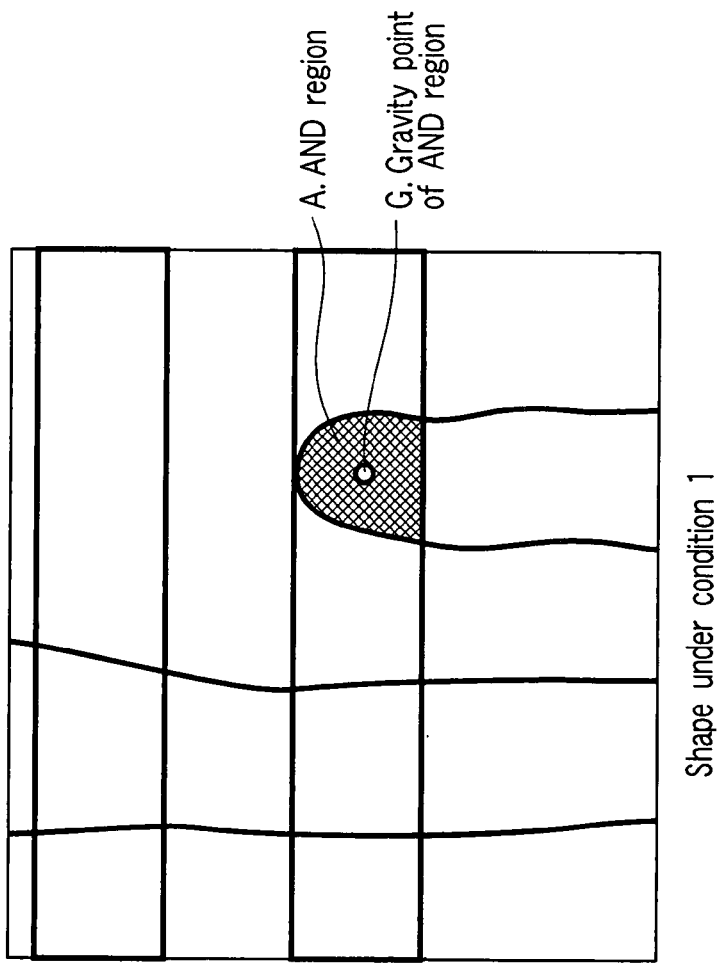
FIGS. 6A and 6B are views for explaining particles about a third step according to a third embodiment.
Figure 6A:
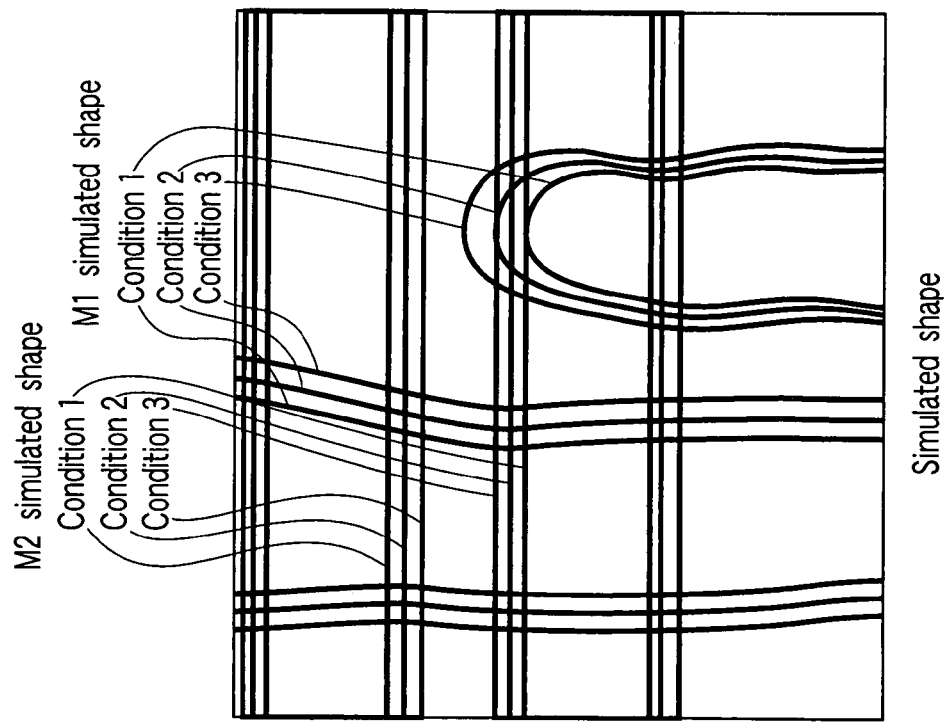

FIG. 6A is a view for explaining particulars about the third process. FIG. 6A shows simulated shapes of a metal lower layer wiring M1 and a metal upper layer wiring M2 on a wafer in the determined pattern layout. When effecting the manufacturing simulation of a pattern shape of each metal wiring layer, as shown in FIG. 6A, this simulation is carried out under a plurality of (e.g., three) process conditions (an exposure amount, a focal depth, and others) while considering an error that occurs in the manufacturing process. Then, in step S15 as a fourth process, a process condition under which a contact area of the metal lower wiring pattern, the metal upper wiring pattern, and the contact hole layer pattern becomes minimum is determined from the plurality of process conditions based on a result of the simulation.

FIG. 6B is a view for explaining particulars about the fourth process. In FIG. 6B, a condition 1 is extracted from the plurality of process conditions. Then, in step S16 as a fifth process, a Boolean operation is used to extract an AND region A where the simulated shape of the metal lower layer wiring M1 pattern overlaps the simulated shape of the metal upper layer wiring M2 pattern under the extracted process condition 1.

Subsequently, in step S17 as a sixth process, a gravity point G of the AND region A is obtained, and the V2 pattern is moved in such a manner that the gravity point G of the AND region A coincides with the center of the contact hole layer V2 pattern. This movement of the V2 pattern is carried out with respect to all V2 patterns included in the pattern layout, and the pattern layout is determined in step S18.

The thus created design data is used to manufacture a photomask. Next, the photomask is mounted on a photolithography apparatus to expose a semiconductor substrate, thereby manufacturing a semiconductor device.

In the thus obtained pattern layout, the contact hole layer pattern is arranged with respect to a corresponding metal wiring layer pattern in such a manner that the center of the contact hole layer pattern coincides with the gravity point of the AND region. Therefore, even if an interlayer matching displacement of the metal wiring layer and the contact hole layer or a dimensional error is present, a contact area of the metal wiring layer and the contact hole layer can be sufficiently assured, thereby obtaining a high process yield in manufacture of the semiconductor device.

The widening processing has been conventionally usually performed with respect to a pattern in design data to improve a lithography margin in a metal wiring layer of a semiconductor device pattern. However, when the widening processing is carried out, the center of the metal wiring layer pattern deviates from the center of a contact hole layer pattern in the design data. When the centers of both the patterns do not match with each other, a risk of a failure in achieving electrical conduction is increased due to an interlayer displacement or shortening of the wiring layer.

In the foregoing embodiments, the center or the gravity point of the metal wiring layer pattern after widening processing is matched with the center of the contact hole layer pattern, or the center of the metal wiring layer pattern after the widening processing approximates the center of the contact hole layer pattern on the maximum level to satisfy predetermined design restrictions, thereby increasing a contact area of the metal wiring layer pattern and the contact hole layer pattern. Therefore, it is possible to suppress a reduction in a process yield due to, e.g., a contact failure of a semiconductor device that is manufactured by using created design data, thus improving the process yield.

According to this embodiment, it is possible to provide the design data creating method that improves a process yield of a semiconductor device manufactured by using created design data, a design data creating program product, and a manufacturing method of a semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A design data creating method of creating design data of a semiconductor device, comprising:
   extracting an AND region of an upper layer wiring pattern and a lower layer wiring pattern that sandwich a contact hole layer pattern included in a pattern layer;
   extracting the contact hole layer pattern included in the AND region; and
   moving, by a computer, the contact hole layer pattern in such a manner that a center of the AND region coincides with a center of the contact hole layer pattern.

2. The method according to claim 1, wherein the AND region is extracted after increasing widths of the upper layer wiring pattern and the lower layer wiring pattern that sandwich the contact hole layer pattern included in the pattern layer.

3. The method according to claim 1, wherein the AND region is extracted by using a Boolean operation.

4. The method according to claim 1, wherein at least one of the upper layer wiring pattern and the lower layer wiring pattern is a metal wiring pattern.

5. A design data creating method of creating design data of a semiconductor device, comprising:
   extracting an AND region of an upper layer wiring pattern and a lower layer wiring pattern that sandwich a contact hole layer pattern included in a pattern layout;
   extracting the contact hole layer pattern included in the AND region; and
   moving, by a computer, the contact hole layer pattern in such a manner that the contact hole layer pattern approximates a center of the AND region on a maximum level to satisfy predetermined design restrictions.

6. The method according to claim 5, wherein the AND region is extracted after increasing widths of the upper layer wiring pattern and the lower layer wiring pattern that sandwich the contact hole layer pattern included in the pattern layer.

7. The method according to claim 5, wherein the AND region is extracted by using a Boolean operation.

8. The method according to claim 5, wherein at least one of the upper layer wiring pattern and the lower layer wiring pattern is a metal wiring pattern.

9. A design data creating method of creating design data of a semiconductor device, comprising:
 simulating a pattern shape of each of an upper layer wiring pattern and a lower layer wiring pattern that sandwich a contact hole layer pattern included in a pattern layout under a plurality of process conditions considering a predetermined process error;
 determining a process condition under which a contact area of the upper layer wiring pattern, the lower layer wiring pattern, and the contact hole layer pattern becomes minimum from the plurality of process conditions based on a result of the simulation;
 extracting an AND region of a simulated shape of the upper layer wiring pattern and a simulated shape of the lower layer wiring pattern under the determined process condition;
 obtaining a gravity point of the AND region; and
 moving, by a computer, the contact hole layer pattern in such a manner that the gravity point of the AND region coincides with a center of the contact hole layer pattern.

10. The method according to claim 9, further comprising:
 increasing widths of the upper layer wiring pattern and the lower layer wiring pattern that sandwich the contact hole layer pattern included in the pattern layer, thereafter performing an optical proximity effect correction with respect to the processed pattern, thereby determining a pattern shape to perform the simulation.

11. The method according to claim 9, wherein the AND region is extracted by using a Boolean operation.

12. The method according to claim 9, wherein at least one of the upper layer wiring pattern and the lower layer wiring pattern is a metal wiring pattern.

13. A computer storage medium comprising a program that, when executed by a computer, causes the computer to execute:
 extracting an AND region of an upper layer wiring pattern and a lower layer wiring pattern that sandwich a contact hole layer pattern included in a pattern layout of a semiconductor device;
 extracting the contact hole layer pattern included in the AND region; and
 moving the contact hole layer pattern in such a manner that a center of the AND region coincides with a center of the contact hole layer pattern, thereby creating design data of the semiconductor device.

14. A computer storage medium comprising a program that, when executed by a computer, causes the computer to execute:
 extracting an AND region of an upper layer wiring pattern and a lower layer wiring pattern that sandwich a contact hole layer pattern included in a pattern layout;
 extracting the contact hole layer pattern included in the AND region; and
 moving the contact hole layer pattern in such a manner that the contact hole layer pattern approximates a center of the AND region on a maximum level to satisfy predetermined design restrictions.

15. A computer storage medium comprising a program that, when executed by a computer, causes the computer to execute:
 simulating a pattern shape of each of an upper layer wiring pattern and a lower layer wiring pattern that sandwich a contact hole layer pattern included in a pattern layout under a plurality of process conditions considering a predetermined process error;
 determining a process condition under which a contact area of the upper layer wiring pattern, the lower layer wiring pattern, and the contact hole layer pattern becomes minimum from the plurality of process conditions based on a result of the simulation;
 extracting an AND region of a simulated shape of the upper layer wiring pattern and a simulated shape of the lower layer wiring pattern under the determined process condition;
 obtaining a gravity point of the AND region; and
 moving the contact hole layer pattern in such a manner that the gravity point of the AND region coincides with a center of the contact hole layer pattern.

16. A manufacturing method of a semiconductor device for forming a pattern on a semiconductor substrate by using a photomask, the photomask being manufactured by using design data of the semiconductor device created by:
 extracting an AND region of an upper layer wiring pattern and a lower layer wiring pattern that sandwich a contact hole layer pattern included in a pattern layout;
 extracting the contact hole layer pattern included in the AND region; and
 moving, by a computer, the contact hole layer pattern in such a manner that a center of the AND region coincides with a center of the contact hole layer pattern.

17. A manufacturing method of a semiconductor device for forming a pattern on a semiconductor substrate by using a photomask, the photomask being manufactured by using design data of the semiconductor device created by:
 extracting an AND region of an upper wiring pattern and a lower wiring pattern that sandwich a contact hole layer pattern included in a pattern layout;
 extracting the contact hole layer pattern included in the AND region; and
 moving, by a computer, the contact hole layer pattern in such a manner that the contact hole layer pattern approximates a center of the AND region on a maximum level to satisfy predetermined design restrictions.

18. A manufacturing method of a semiconductor device for forming a pattern on a semiconductor substrate by using a photomask, the photomask being manufactured by using design data of the semiconductor device created by:
 simulating a pattern shape of each of an upper wiring pattern and a lower wiring pattern that sandwich a contact hole layer pattern included in a pattern layout under a plurality of process conditions considering a predetermined process error;
 determining a process condition under which a contact area of the upper wiring pattern, the lower wiring pattern, and the contact hole layer pattern becomes minimum from the plurality of process conditions based on a result of the simulation;
 extracting an AND region of a simulated shape of the upper wiring pattern and a simulated shape of the lower wiring pattern under the determined process condition;
 obtaining a gravity point of the AND region; and
 moving, by a computer, the contact hole layer pattern in such a manner that the gravity point of the AND region coincides with a center of the contact hole layer pattern.

* * * * *